United States Patent [19]

Dallessandro et al.

[11] Patent Number: 4,597,890

[45] Date of Patent: Jul. 1, 1986

[54] SOLVENT BLEND FOR REMOVING FLUX RESIDUES

[75] Inventors: Susan M. Dallessandro; Wesley L. Archer, both of Midland, Mich.; Stephen P. Krupp, Lake Jackson, Tex.

[73] Assignee: The Dow Chemical Company, Midland, Mich.

[21] Appl. No.: 702,289

[22] Filed: Feb. 15, 1985

[51] Int. Cl.⁴ .................. B08B 3/08; C07C 17/42; C11D 7/50; C23G 5/028

[52] U.S. Cl. ........................... 252/153; 134/31; 134/38; 134/40; 252/170; 252/171; 252/172; 570/107; 570/108; 570/110; 570/118

[58] Field of Search ........... 570/107, 108, 110, 118; 252/153, 170, 171, 172, 173; 134/31, 38, 40

[56] References Cited

U.S. PATENT DOCUMENTS

| | | | |
|---|---|---|---|
| 3,049,571 | 8/1962 | Brown | 570/110 |
| 3,326,988 | 6/1967 | Stack | 252/171 |
| 3,932,297 | 1/1976 | Clementson | 252/171 |
| 3,974,230 | 8/1976 | Archer | 570/118 |
| 4,023,984 | 5/1977 | Clementson | 134/38 |
| 4,524,011 | 6/1985 | Tasset | 252/171 |

OTHER PUBLICATIONS

Dow Chemical Bulletin: "PRELETE—New Generation Defluxer for High Efficiency PWA Defluxing", Form No. 100-5927-83, published by Dow Chemical, U.S.A., Midland, Michigan 48640.

Dow Bulletin: "CHLOROTHENE SM and Methylene Chloride Solvents", Form No. 100-5869-82, published by Dow Chemical, U.S.A., Midland, Mich. 48640.

*Primary Examiner*—Dennis L. Albrecht
*Attorney, Agent, or Firm*—A. C. Ancona

[57] ABSTRACT

Stable methylchloroform solvent compositions in combination with from about 3 to about 5 volume percent of 2-butanol and from about 1 to about 3 volume percent of 3-methyl-1-butyn-3-ol have been shown to be superior solvents for removing flux from circuit boards. Such compositions have no flash point and maintain excellent distribution of the components in the vapor and liquid sections of the defluxing apparatus.

3 Claims, No Drawings

SOLVENT BLEND FOR REMOVING FLUX RESIDUES

BACKGROUND OF INVENTION

The electronics industry requires circuit boards which are substantially free of ionic and organic flux residues since such contribute to failure of the circuit board in use. Therefore, stringent methods are employed to clean the boards of both ionic and organic residues. Numerous solvents and mixtures of solvents have been tried and discarded. The most widely used commercial solvent is 1,1,2-Trifluoro-1,2,2-trichloroethane (Fluorocarbon 113) in admixture with 10.67 volume percent methanol and 0.33 volume percent nitromethane. This solvent effectively cleans from the soldered circuit board the rosin flux soldering aids. The cleaning effectiveness is measured by standard procedures in the industry, one of which is set by the U.S. military which is a specification for "Printed Wiring Assemblies" MIL-P-28809. This test consists of spraying or immersing the cleaned board in a freshly prepared aqueous isopropyl alcohol solution for a specified period of time after which the resistivity of the solution is measured in ohm-cm. The effectiveness of a flux removal blend is a function of the cleaning time, flux composition and the type of cleaning operation. All these being equal, the more effective blends will give a higher specific resistance value when tested according to the above test or similar standard test.

The above mentioned fluorocarbon blend has been shown by industrial experience and by means of the above test to be an effective flux removal solvent. Generally, chlorinated hydrocarbons alone or in combination with alkanols below the flash point level give poorer results, particularly with respect to removal of ionic components of the flux. It is important that the blends used by the industry have no flash point for the obvious safety reason.

It is also known that chlorinated hydrocarbons, especially 1,1,1-trichloroethane (methylchloroform), will remove the nonionic components of the rosin flux solder aids better than the aforementioned fluorocarbon blend.

Patents disclosing flux removing compositions are U.S. Pat. Nos. 3,932,297 and 4,023,984, claiming methylchloroform with n-propyl alcohol and isopropyl alcohol, respectively; U.S. Pat. No. 3,733,218 discloses flux removing blends of perchloroethylene and trichloroethylene, each with different alcohols which form azeotropes. An azeotropic composition of a fluorocarbon and n-butyl alcohol is disclosed in U.S. Pat. No. 3,671,446 as useful in cleaning circuit boards.

It, therefore, would be advantageous to have a chlorinated solvent composition which will effectively remove both ionic and nonionic flux residues and has no flash point. The present invention provides such a composition which comprises a stabilized methylchloroform in combination with a mixture of methylbutynol and 2-butanol.

There are numerous patents which disclose the use of various alcohols as stabilizers for methylchloroform. Among these are U.S. Pat. Nos. 3,049,571; 3,192,273; 3,326,988; 3,360,575; 3,499,047; 3,565,811; 3,746,648; 3,974,230; 4,018,837; 4,115,461 and 4,324,928. Alcohols included in these patents are 2-butanol, 2-methylbutan-2-ol, 2-methylpropan-2-ol, butynol and 3-methyl-1-butyn-3-ol in combination with various other known stabilizers, e.g. nitromethane and/or nitroethane, butylene oxide, dioxane, and the like, for methylchloroform.

SUMMARY OF THE INVENTION

Stabilized methylchloroform solvent compositions in combination with from about 3 to about 5 volume percent of 2-butanol and from about 1 to about 3 volume percent of 3-methyl-1-butyn-3-ol have been shown to be superior solvents for removing flux from circuit boards. Such compositions have no flash point and maintain excellent distribution of the solubilizing components in the vapor and liquid sections of the defluxing apparatus.

DETAILED DESCRIPTION OF THE INVENTION

A series of experiments was carried out employing several formulations of a stabilized methylchloroform containing different concentrations of 2-butanol and the 3-methyl-1-butyn-3-ol and the results were compared under the same experimental conditions using a 1,1,2-trifluoro-1,2,2-trichloroethane composition and other solvent formulations which are widely used by industry to remove flux residues from circuit boards.

Test Procedures

1. Test to determine ionic residues:

Tests were run in an open top batch degreaser and a production size in-line degreaser. The batch degreaser had the standard compartmentalization: a boiling sump chamber, a water separator and a condensate collection chamber (warm dip). This particular degreaser also has a spray wand which sprayed clean solvent obtained from the condensate collection chamber.

The in-line degreaser also had the usual compartments: boil sump, water separator, warm dip, and still (distillation unit). The conveyor speed was in feet per minute. Three high-pressure sprays were also employed while the boards passed through the cleaning zone. These were as follows: a pre-clean spray, a high-pressure spray and a distillate spray.

Test circuit boards were fluxed with a commercially available flux and then wave soldered on conventional equipment. After soldering, the boards were cleaned in a degreaser. This cleaning step involves a solvent contact in the degreaser. Solvents will be discussed later. When cleaning boards in the batch open-top degreaser, the following timing sequence was followed: two minutes in the boiling sump area, two minutes of spray with clean solvent condensate, and one minute of vapor zone exposure. When using the in-line degreaser, the rate was held between 3.1 and 3.5 feet per minute.

The circuit boards thus cleaned were dimensionally measured for surface area, and measured for residual ionic contamination by use of an Omega Ω Meter II* (a standard measuring device used in detection and quantification of ionic residues). The solution contained in this instrument was a 75% (vol.) 2-Propanol/deionized water mixture. The volume of this solution used to wash residual ionics was recorded with each style of circuit board tested and used to calculate final contamination reported as milligrams NaCl/square inch circuit board.

*Registered trademark of Kenco Alloy & Chemical Co., Inc.

2. Test to determine resistance to corrosion of aluminum:

The test consisted of placing aluminum (Al 2024) shavings in a flask containing the liquid solvent blend. A condenser was attached to the flask and the solvent heated to boiling and refluxed by the condenser for a period of seven days, during which time observations were made of the shavings. If no corrosion of the aluminum was observed by the end of seven days, the blend was considered to have passed the test.

3. Flash point determination**:

If the blend had a flash point, it was considered to have failed. No observable flash point indicates the solvent passed, or was acceptable. The results of these tests are given in Table I, failed and passed being indicated by F and P, respectively. Ionic residue is given in mg NaCl/in$^2$.

**The method used was ASTM-92 known as the Cleveland Open Cup flash point method.

COMPARATIVE EXAMPLE A

The above test procedures were conducted using a commercially available inhibited methylchloroform consisting of:

95.7% Methylchloroform (MC)
0.7% 1,2-Butylene oxide (BO)
0.4% Nitromethane (NM)
3.2% Diethylene ether (DEE).

COMPARATIVE EXAMPLE B

A commercially available flux removal blend was also tested as above. The blend consisted of:

89% Fluorocarbon 113
10.67% Methanol
0.33% Nitromethane.

COMPARATIVE EXAMPLE C

The above tests were also performed using a commercially available inhibited methylchloroform (93%) with 7.0% 1-Propanol, which is also a commercially available product used in defluxing operations.

COMPARATIVE EXAMPLE D

The above tests were also performed on a blend of Comparative Example A stabilized methylchloroform which also contained 3% each of secondary butanol and n-butanol.

Percentages in Examples A–C above as well as succeeding examples are all by volume unless otherwise indicated.

Table I shows results of testing for the formulations of Comparative Examples A–E and those of the invention Examples 1–3.

TABLE I

| Ex. No. | Blend[1] MeOH (%) | Blend[1] SBA (%) | Blend[1] MBY (%) | FP[2] | Al Corrosion | Ionic Residue (Mg NaCl/in$^2$) ALPHA 611F*** | Ionic Residue (Mg NaCl/in$^2$) ALPHA 711*** |
|---|---|---|---|---|---|---|---|
| A | — | — | — | P | P | — | — |
| B | 10.67 | — | — | P | P | — | 0.0314 |
| C* | — | 7.0 (NPA) | — | P | F | — | 0.0113 |
| D** | — | 3.0 | 3.0 (NBA) | P | P | 0.0115 | — |
| E | 1.0 | 3.0 | 3.0 | P | P | — | 0.0105 |
| 1 | — | 3.0 | 3.0 | P | P | — | — |
| 2 | — | 4.0 | 2.0 | P | P | 0.0118 | 0.0235 |
| 3 | — | 5.0 | 1.0 | P | P | — | 0.0230 |

*This formulation contains 93% of a stabilized methylchloroform but not those stabilizers in A.
**This formulation contains 3.0% 1-butanol in addition to the SBA.
***Flux
MeOH = methanol, NPA = 1-propanol, SBA = 2-butanol, MBY = 3-methyl-1-butyn-3-ol, NBA = 1-butanol
[1]Volume percent of additives added to composition set forth under Comparative Examples A, B, C, D and E and with respect to Examples 1, 2 and 3 the stabilized methylchloroform of Comparative Example A.
[2]Cleveland Open Cup Flash Point 4. Another test was performed to determine the distribution of the components in vapor and liquid phases in various formulations of the invention and formulations employed as flux removers known to the trade:

A sample of each formulation was fractionally distilled using an 8 inch Vigreux column and an 11½ inch straight tube water cooled condenser. Into a 500 ml pot was placed 400 ml of each sample. The sample was then fractionally distilled. The pot and overhead temperatures were recorded along with the cut volumes. Each cut was then analyzed by gas chromatography for the amount of the different components. The data is presented in tabular form in the following examples.

COMPARATIVE EXAMPLE F*

| Cut # | Vol. (ml) | Temp. (°C.) OH | Temp. (°C.) Pot | Components (Vol. %) BO | Components (Vol. %) DEE | Components (Vol. %) NM |
|---|---|---|---|---|---|---|
| Original | 400 | — | — | 0.72 | 3.36 | 0.41 |
| 1 | 33 | 73 | 76 | 1.22 | 0.48 | 1.35 |
| 2 | 100 | 74 | 77 | 1.11 | 0.58 | 0.93 |
| 3 | 100 | 74 | 78 | 0.79 | 0.80 | 0.29 |
| 4 | 67 | 74 | 79 | 0.50 | 1.37 | 0.07 |
| 5 | 60 | 75 | 82 | 0.21 | 2.91 | N.D. |
| Pot | 40 | — | — | 0.02 | 16.7 | 0.03 |

*This comparative formulation is a stabilized methylchloroform (1,1,1-trichloroethane).

COMPARATIVE EXAMPLE G

| Cut # | Vol. (ml) | Temp. (°C.) OH | Temp. (°C.) Pot | Components (Vol. %) MeOH | Components (Vol. %) NM |
|---|---|---|---|---|---|
| Original | 400 | — | — | 10.67 | 0.33 |
| 1 | 5 | 40 | 42 | 9.8 | 0.16 |
| 2 | 100 | 40 | 42 | 10.15 | 0.18 |
| 3 | 100 | 40 | 42 | 10.2 | 0.22 |
| 4 | 100 | 40 | 42 | 10.3 | 0.32 |
| 5 | 23 | 42 | 49 | 9.4 | 0.68 |
| Pot | 72 | — | — | N.D. | 0.45 |

COMPARATIVE EXAMPLE H*

| Cut # | Vol. (ml) | Temp. (°C.) OH | Temp. (°C.) Pot | Components (Vol. %) BO | Components (Vol. %) DEE | Components (Vol. %) NM | Components (Vol. %) SBA | Components (Vol. %) NBA |
|---|---|---|---|---|---|---|---|---|
| Orig. | 400 | — | — | 0.7 | 3.23 | 0.34 | 3.0 | 2.96 |
| 1 | 33 | 73 | 76 | 1.01 | 0.35 | 1.08 | 3.32 | 0.81 |
| 2 | 100 | 73 | 77 | 0.93 | 0.37 | 0.75 | 3.28 | 0.89 |
| 3 | 100 | 73 | 78 | 0.77 | 0.5 | 0.31 | 2.98 | 1.06 |
| 4 | 67 | 74 | 80 | 0.56 | 1.03 | 0.06 | 2.63 | 1.47 |

-continued

| | Vol. | Methylchloroform Formulation | | | | | | | |
|---|---|---|---|---|---|---|---|---|---|
| | | Temp. (°C.) | | Components (Vol. %) | | | | | |
| Cut # | (ml) | OH | Pot | BO | DEE | NM | SBA | NBA | |
| 5 | 60 | 76 | 98 | 0.39 | 2.34 | 0.06 | 2.54 | 1.74 | |
| Pot | 40 | 76 | 83 | 0.01 | 31.8 | 0.09 | 5.37 | 29.9 | |

*This comparative formulation is a stabilized methylchloroform (1,1,1-trichloroethane).

COMPARATIVE EXAMPLE I*

| | Vol. | Methylchloroform Formulation | | | | | | | |
|---|---|---|---|---|---|---|---|---|---|
| | | Temp. (°C.) | | Components (Vol. %) | | | | | |
| Cut # | (ml) | OH | Pot | BO | SBA | DEE | NM | MBY | MeOH |
| Orig. | 400 | — | — | 0.66 | 3.01 | 3.08 | 0.4 | 2.83 | 1.0 |
| 1 | 33 | 73 | 77 | 0.61 | 2.06 | 0.34 | 0.65 | 1.37 | 8.86 |
| 2 | 100 | 73 | 77 | 0.93 | 3.2 | 0.37 | 0.72 | 1.99 | 0.04 |
| 3 | 100 | 73 | 78 | 0.84 | 3.28 | 0.52 | 0.4 | 2.26 | — |
| 4 | 80 | 74 | 80 | 0.61 | 2.83 | 0.87 | 0.14 | 2.3 | — |
| 5 | 47 | 75 | 84 | 0.43 | 2.85 | 2.43 | 0.05 | 2.39 | — |
| Pot | 40 | 76 | 84 | 0.1 | 4.75 | 31.78 | — | 12.76 | — |

*This comparative formulation is a stabilized methylchloroform (1,1,1-trichloroethane).

EXAMPLE 4

| | Vol. | Methylchloroform Formulation | | | | | | |
|---|---|---|---|---|---|---|---|---|
| | | Temp. (°C.) | | Components (Vol. %) | | | | |
| Cut # | (ml) | OH | Pot | BO | DEE | NM | SBA | MBY |
| Orig. | 400 | — | — | 0.67 | 2.93 | 0.37 | 2.91 | 2.98 |
| 1 | 33 | 74 | 77 | 0.87 | 0.28 | 1.12 | 3.03 | 2.01 |
| 2 | 100 | 74 | 77 | 0.85 | 0.28 | 0.8 | 3.01 | 2.08 |
| 3 | 100 | 74 | 77 | 0.81 | 0.39 | 0.35 | 2.85 | 2.19 |
| 4 | 67 | 75 | 78 | 0.59 | 0.81 | 0.09 | 2.68 | 2.34 |
| 5 | 60 | 74 | 79 | 0.36 | 2.31 | 0.01 | 2.61 | 2.25 |
| Pot | 40 | 76 | 83 | 0.01 | 50.99 | 0.04 | 2.38 | 18.25 |

EXAMPLE 5

| | Vol. | Methylchloroform Formulation | | | | | | |
|---|---|---|---|---|---|---|---|---|
| | | Temp. (°C.) | | Components (Vol. %) | | | | |
| Cut # | (ml) | OH | Pot | BO | DEE | NM | SBA | MBY |
| Orig. | 400 | — | — | .72 | 3.28 | 0.39 | 3.98 | 1.97 |
| 1 | 18 | 74 | 77 | 0.99 | 0.28 | 1.13 | 3.97 | 1.24 |
| 2 | 100 | 74 | 77 | 0.97 | 0.32 | 0.92 | 4.06 | 1.34 |
| 3 | 100 | 74 | 77 | 0.86 | 0.4 | 0.52 | 3.97 | 1.4 |
| 4 | 53 | 74 | 78 | 0.72 | 0.53 | 0.25 | 3.72 | 1.47 |
| 5 | 15 | 74 | 79 | 0.68 | 0.68 | 0.17 | 3.79 | 1.55 |
| 6 | 108 | 76 | 83 | 0.47 | 1.73 | 0.04 | 3.46 | 1.55 |
| Pot | 26 | — | — | 0.08 | 34.55 | 0.03 | 5.02 | 8.22 |

It should be noted that, while numerous alcohols have been employed as stabilizers for methylchloroform and in combination with the particular stabilizers employed in the present formulation, the combinations have not been used in the particular amounts and/or ratios which would make a superior flux removing solvent as shown by examples of the present invention.

The formulations of the present invention are as good as or better than the known defluxing compositions with respect to removing the flux residues. They are also superior with respect to the distribution of the components in both vapor and liquid phases. This is important since the cleaning operation is conducted in both liquid and vapor phase by contacting the circuit board alternately in the two phases. It is important that not only the inhibitors be present in both phases, but that the alcohols which provide solvency for the flux components also be present in both liquid and vapor phases during use. These compositions have no flash point and are substantially non-corrosive under use conditions.

The invention described herein, therefore, is a composition of a stabilized methylchloroform in combination with from 3 to 5% of 2-butanol and from 1 to 3% of 3-methyl-1-butyn-3-ol. A preferred composition is that which employs 92-96% of a stabilized methylchloroform wherein the stabilizers are butylene oxide (0.69-0.80%), nitromethane (0.35-0.45%) and diethylene ether (3.0-3.4%), all volume percent.

We claim:

1. A methylchloroform defluxing solvent composition have no flash point as measured by Cleveland Open Cup method consisting of:
   (a) 93 to 96% by volume of methylchloroform containing by volume (1) 0.69-0.80% butylene oxide, (2) 0.35-0.45% nitromethane and (3) 3.0-3.4% diethylene ether as stabilizers based on the methylchloroform and
   (b) 4 to 7% by volume of a mixture of 2-butanol and 3-methyl-1-butyn-3-ol wherein the alcohols are present in amounts of 3 to 5% and 1 to 2%, respectively, based on the total volume of the defluxing composition.

2. The composition of claim 1 wherein 2-butanol and 3-methyl-1-butyn-3-ol are present in amounts of about 4% and 2%, respectively, based on the total volume of the defluxing composition.

3. In a method of cleaning electronic circuit boards by contact with the liquid and/or vapor of a solvent composition in which one or more of the ionic or organic flux residues associated with preparation of circuit boards the improvement which comprises employing as the solvent composition the composition of claim 1.

* * * * *

UNITED STATES PATENT AND TRADEMARK OFFICE
CERTIFICATE OF CORRECTION

PATENT NO. : 4,597,890

DATED : July 1, 1986

INVENTOR(S) : Susan M. Dallessandro, Wesley L. Archer and Stephen P. Krupp

It is certified that error appears in the above—identified patent and that said Letters Patent is hereby corrected as shown below:

Col. 3, line 58, Table I, for heading "Ionic Residue"; change "(Mg NaCl/in$^2$)" to --(mg NaCl/in$^2$)--.

Col. 5, under Example 5, line 1 under heading "BO"; change ".72" to --0.72--.

Signed and Sealed this

Seventeenth Day of February, 1987

Attest:

DONALD J. QUIGG

Attesting Officer

Commissioner of Patents and Trademarks